US012724951B2

(12) United States Patent
Jyu et al.

(10) Patent No.: US 12,724,951 B2
(45) Date of Patent: Sep. 1, 2026

(54) REAL TIME VIEW SWAPPING (RTVS) IN A MIXED SIGNAL SIMULATION

(71) Applicant: Synopsys, Inc., Mountain View, CA (US)

(72) Inventors: Henry Jyu, Cupertino, CA (US); Xiaonan Shi, Shanghai (CN); Tingting Jiang, Shanghai (CN)

(73) Assignee: Synopsys, Inc., Sunnyvale, CA (US)

( * ) Notice: Subject to any disclaimer, the term of this patent is extended or adjusted under 35 U.S.C. 154(b) by 1137 days.

(21) Appl. No.: 17/710,237

(22) Filed: Mar. 31, 2022

(65) Prior Publication Data

US 2022/0327272 A1 Oct. 13, 2022

Related U.S. Application Data

(60) Provisional application No. 63/168,763, filed on Mar. 31, 2021.

(51) Int. Cl.

| | |
|---|---|
| ***G06F 30/367*** | (2020.01) |
| ***G06F 30/392*** | (2020.01) |
| ***G06F 30/398*** | (2020.01) |

(52) U.S. Cl.

CPC .......... *G06F 30/367* (2020.01); *G06F 30/392* (2020.01); *G06F 30/398* (2020.01)

(58) Field of Classification Search

CPC ..... G06F 30/367; G06F 30/392; G06F 30/398

USPC .......................................................... 703/14

See application file for complete search history.

(56) References Cited

U.S. PATENT DOCUMENTS 5,963,724 A * 10/1999 Mantooth ................. G06F 8/34 703/4
6,236,956 B1 * 5/2001 Mantooth ............. G06F 30/367 703/2
6,801,881 B1 * 10/2004 Shah ...................... G05B 17/02 700/121
6,820,243 B1 * 11/2004 Shey ..................... G06F 30/367 716/106

(Continued)

FOREIGN PATENT DOCUMENTS

WO WO-2022212751 A1 * 10/2022 ........... G06F 30/398

OTHER PUBLICATIONS

International Search Report and Written Opinion of the International Searching Authority directed to related International Patent Application No. PCT/US2022/022898, mailed Jul. 15, 2022; 13 pages.

(Continued)

*Primary Examiner* — Iftekhar A Khan
(74) *Attorney, Agent, or Firm* — Lowenstein Sandler LLP

(57) ABSTRACT

A method, a system, and a non-transitory computer readable medium for simulating a circuit are provided. The method includes generating a digital simulation file for the circuit that includes a block, generating a mixed simulation file for the circuit, generating a waveform file by executing the digital simulation file for a first time window of a simulation, determining a plurality of analog values for the block based on the waveform file, and executing, by a processor, the mixed simulation file for a second time window of the simulation with the plurality of analog values annotated to the block at a start of the second time window. The digital simulation file corresponds to the block in a digital view and the mixed simulation file corresponds to the block in an analog view.

18 Claims, 8 Drawing Sheets

(56) References Cited

U.S. PATENT DOCUMENTS 6,961,689 B1 * 11/2005 Greenberg .............. G06F 30/33 703/4
7,299,164 B2 * 11/2007 Courtay ................ G06F 30/367 703/2
7,672,827 B1 * 3/2010 Schapira ............... G06F 30/367 703/14
7,761,279 B1 * 7/2010 Cai ....................... G06F 30/367 703/16
7,865,348 B1 * 1/2011 Au ........................ G06F 30/367 716/136
8,201,137 B1 * 6/2012 Bhushan ............... G06F 30/367 716/132
8,255,191 B1 * 8/2012 Kolpekwar ............. G06F 30/33 703/2
8,296,699 B1 * 10/2012 Chetput ................ G06F 30/367 716/106
8,478,576 B1 * 7/2013 Cameron .............. G06F 30/367 703/13
8,504,346 B1 * 8/2013 Kolpekwar ........... G06F 30/367 703/13
8,554,530 B1 * 10/2013 O'Riordan .............. G06F 30/33 716/106
8,949,100 B1 * 2/2015 Cranston ............... G06F 30/331 703/14
9,047,424 B1 * 6/2015 Baker ................... G06F 30/367
10,262,088 B1 * 4/2019 Turbovich ............ G06F 30/367
11,017,139 B1 * 5/2021 Roy .................... G06F 30/3308
11,023,640 B1 * 6/2021 Keller ................... G06F 30/367
11,334,702 B1 * 5/2022 Banerjee ............... G06F 30/367
11,847,392 B1 * 12/2023 Lin ....................... G06F 30/367
2002/0049576 A1 * 4/2002 Meyer ................... G06F 30/367 703/4
2003/0149962 A1 * 8/2003 Willis ................... G06F 30/367 712/15
2005/0080600 A1 * 4/2005 Courtay ................ G06F 30/367 703/2
2005/0143966 A1 * 6/2005 McGaughy ........... G06F 30/367 703/3
2006/0190230 A1 * 8/2006 Patterson ................ G06F 30/33 703/14
2006/0225009 A1 * 10/2006 Reddy ................... G06F 30/367 716/136
2007/0101302 A1 * 5/2007 Okamoto .............. G06F 30/367 716/135
2012/0246606 A1 * 9/2012 Krauch ............... G06F 30/3312 716/113
2013/0338991 A1 * 12/2013 Lin ......................... G06F 30/38 703/14
2014/0067357 A1 * 3/2014 Fang ..................... G06F 30/367 703/17
2016/0070834 A1 * 3/2016 Le ....................... G06F 30/3312 716/113
2017/0024504 A1 * 1/2017 Branch ................... G06F 30/33
2017/0083651 A1 * 3/2017 Akkaraju ............ G06F 30/3323
2017/0316137 A1 * 11/2017 James ................... G06F 30/367
2018/0129767 A1 * 5/2018 Akkaraju ................ G06F 30/33
2020/0065114 A1 * 2/2020 Garg ..................... G06F 9/5066
2020/0104497 A1 * 4/2020 Crouch ................... G06F 21/76
2023/0315964 A1 * 10/2023 Kolpekwar ............. G06F 30/38 703/14

OTHER PUBLICATIONS

"CircuitLogix," Wikipedia Article, last updated Jul. 22, 2020; 4 pages.

Schneider et al., "Multi-Level Timing Simulation on GPUs," Proceedings of the 23rd Asia and South Pacific Design Automation Conference, Jan. 22, 2018; 7 pages.

* cited by examiner

REAL TIME VIEW SWAPPING (RTVS) IN A MIXED SIGNAL SIMULATION

CROSS-REFERENCE TO RELATED APPLICATIONS

The present application claims the benefit under 35 U.S.C. § 119(e) of U.S. Provisional Patent Application No. 63/168,763 filed on Mar. 31, 2021, which is incorporated herein by reference in its entirety for all purposes.

TECHNICAL FIELD

The present disclosure relates to the simulation of an integrated circuit. More specifically, the present disclosure relates to real time view swapping in a mixed signal simulation.

BACKGROUND

In electronic design automation (EDA), simulators are designed to simulate a behavior of a circuit in response to stimuli. There are two major types of simulators: analog circuit simulators and digital logic simulators. An analog circuit simulator uses highly accurate models (i.e., representations) of the circuit to achieve high accuracy. Signals are propagated as continuously varying values in an analog circuit simulation. An input circuit for the analog circuit simulator is generally in simulation program with integrated circuit emphasis (SPICE) format. A digital logic simulator uses functional representations of the circuit. Rather than propagating continuously varying values, a few discrete voltage levels (e.g., primary logic 0 and logic 1) are propagated. An input logic design for the digital logic simulator is generally in a hardware description language (HDL) format, such as Verilog. The analog circuit simulator can achieve higher accuracy in predicting the behavior of the circuit, compared to the digital logic simulator. However, the digital logic simulator is typically two orders faster than the analog circuit simulator. Accordingly, there is a tradeoff between accuracy and speed.

SUMMARY

In one aspect, a method includes generating a digital simulation file for the circuit that includes a block, generating a mixed simulation file for the circuit, generating a waveform file by executing the digital simulation file for a first time window of a simulation, determining a plurality of analog values for the block based on the waveform file, and executing, by a processor, the mixed simulation file for a second time window of the simulation with the plurality of analog values annotated to the block at a start of the second time window. The digital simulation file corresponds to the block in a digital view and the mixed simulation file corresponds to the block in an analog view.

In one aspect, a system includes a memory storing instructions and a processor coupled with the memory and to execute the instructions. The instructions when executed cause the processor to generate a digital simulation file for the circuit that includes a block and wherein the digital simulation file corresponds to the block in a digital view, generate a mixed simulation file for the circuit, wherein the mixed simulation file corresponds to the block in an analog view, generate a waveform file by executing the digital simulation file for a first time window of a simulation, determine a plurality of analog values for the block based on the waveform file, and execute the mixed simulation file for a second time window of the simulation with the plurality of analog values annotated to the block at a start of the second time window.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to real time view swapping (RTVS) in a mixed signal simulation. In a mixed signal simulation, to better trade off accuracy and speed, an analog circuit simulation and a digital logic simulation are combined in one simulation. In a conventional flow of the mixed signal simulation, the users can set certain blocks of a circuit design to be simulated in a digital view (e.g., Verilog) by a digital simulator. And, the other blocks can be set in an analog view (e.g., SPICE) to be simulated by an analog simulator. This is referred to as the mixed signal simulation or mixed signal verification (MSV). However, in the conventional flow of the mixed signal simulation, the block setting for the digital view and the analog view are fixed throughout the simulation (i.e., a block is either in the digital view or in the analog view throughout the simulation).

Embodiments disclosed herein solve the problem of fixed views throughout a simulation period in mixed signal simulations. In some embodiments, a user may specify different views (simulated by different simulators) dynamically at different time windows during the simulation for the same block. In some embodiments, the approaches described herein provide time-based co-simulation so that the user can switch device views dynamically in the transient simulation.

Advantages of the present disclosure include, but are not limited to, providing flexibility for users to trade off accuracy and performance. For example, benefits may include higher speed than the conventional mixed signal simulation while preserving the desired accuracy for certain portion of the simulation, as the block setting is not fixed throughout the simulation.

In some embodiments, a digital simulator and an analog simulator are used. In some aspects, the digital simulator can be Synopsys VCS®. In some aspects, the analog simulator can be FineSim™ and/or PrimeSim™ from Synopsys. However, the techniques described herein are not limited to any specific simulator.

For illustration purpose, an example that includes three simulation windows (a first window, a second window, and a third window) is used to describe the RTVS implementation. In this example, the first window and the third window are pure-digital simulation. The second window is a MSV simulation. So at the beginning of the second window and at the beginning of the third window, some blocks of the circuit call for a switch from the digital view to the analog view and then from the analog view to the digital view.

Figure 1A:
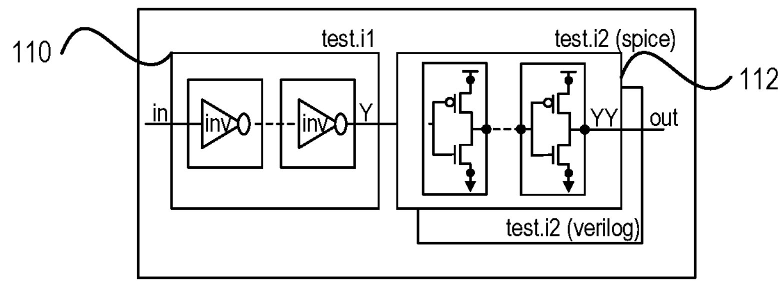
FIG. 1A is a schematic that illustrates a conventional mixed signal simulation (with fixed block settings).
Figure 1A:
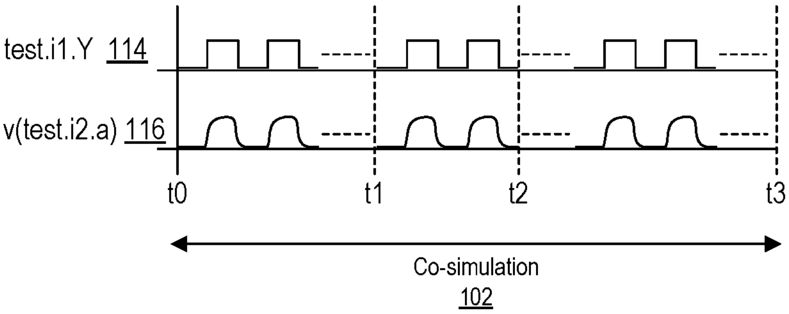

FIG. 1A is a schematic that illustrates a conventional mixed signal simulation. In the conventional mixed signal simulation, block settings are fixed. For example, a first block 110 is tested in a digital view and a second block 112 is tested in an analog view. In some aspects, a command "use_spice-cell inv_chain" may be used to run the co-simulation during the simulation window 102 from t0 to t3. Waveform 114 shows the digital waveform corresponding to the first block 110 and waveform 116 shows the analog waveform corresponding to the second block 112. As discussed previously herein, in conventional mixed signal simulation, the block settings are fixed. Thus, the first block 110 is run in digital view for the whole simulation window 102 (i.e., from t0 to t3) and the second block 112 is run in analog view for the whole simulation window 102.

Figure 1B:
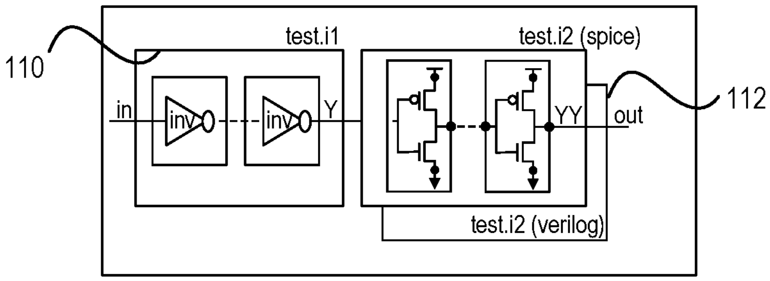
FIG. 1B is a schematic that illustrates a mixed signal simulation where a block setting switches between a digital view and an analog view during the simulation, in accordance with an embodiment of the present disclosure.
Figure 1B:
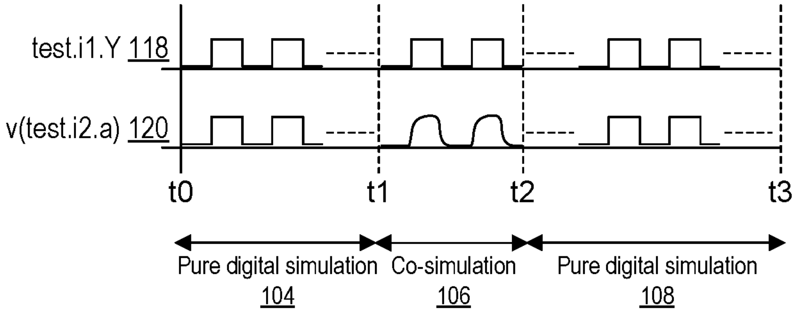

FIG. 1B is a schematic that illustrates a mixed signal simulation in accordance with an embodiment of the present disclosure. The first block 110 is tested in the digital view for the whole simulation window (i.e., from t0 to t3). The second block 112 is tested in the digital view and in the analog view. The setting of the second block 112 switches between the digital view and the analog view during the simulation. Thus, in a first time window 104, both the first block 110 and the second block 112 are in digital view and pure digital simulation is run. In a second time window 106, the first block 110 is in digital view and the second block 112 is the analog view. In a third time window 108, both the first block 110 and the second block 112 are in the digital view and pure digital simulation is run for both blocks.

In some embodiments, in the second time window 106 the following command may be used:

```
use_spice-cell inv_chain enter=t1 exit=t2.
```

Figure 2:
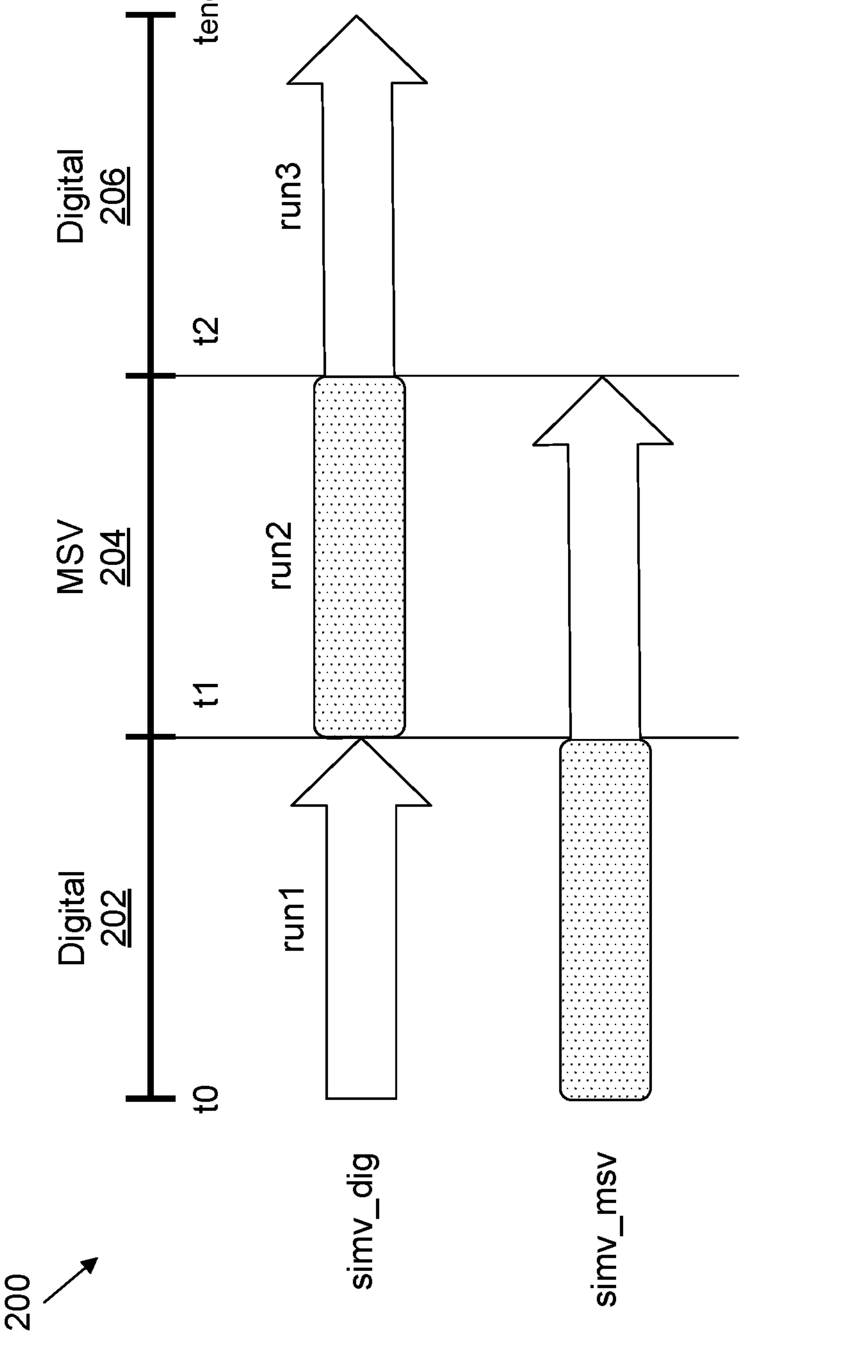
FIG. 2 is a schematic that illustrates a mixed signal simulation with three time windows, in accordance with an embodiment of the present disclosure.

FIG. 2 is a schematic 200 that illustrates a mixed signal simulation with three time windows in accordance with an embodiment of the present disclosure. Schematic 200 illustrates an example of two executables associated with the digital and mixed simulation (i.e., digital simv and msv simv) running one after another.

In some embodiments, a user may specify a MSV window 204 in an initial file. For example, the user may specify a start time and an end time of the MSV window 204 (e.g., from 30 ns to 60 ns) in the initial file. The RTVS flow described herein may automatically generate the executable (i.e., simv) and launch the simulation according to the specification of the user.

In some embodiments, to achieve time-based co-simulation, different compiled Verilog binaries (digital/mixed) are automatically generated and run one by one in different time windows specified by the user. In some aspects, this functionality is invoked by a new command in a setup file or a configuration file of a mixed-signal verification tool. For example, a command (e.g., multi_view_sim) may be used in the configuration file (e.g., cosim setup file) of the mixed-signal verification tool. The command may be used to describe a window duration for each view configuration. In some embodiments, the command (e.g., multi_view_sim_command) can allow users to specify multiple (unlimited) windows. Each window can have its own view configuration and its own simulation control, including an initial condition. This provides the most flexibility and control in the mixed signal simulation.

In some embodiments, a binary utility (e.g., called "msv_mview_vcs") may execute a mixed-signal compilation and a digital compilation to generate corresponding executables and to launch digital and mixed-signal simulations one by one based on the window specifications.

In some embodiments, the utility (e.g., "msv_mview_vcs") may automatically launch a first run, then a second run, and then a third run as shown in FIG. 2.

The first run is associated with a first window 202. Thus, the simulation is run in digital view from 0 ns to 30 ns. The second run is associated with the second window 204. The simulation is run in the mixed signal view from 30 ns to 60 ns. The third run is associated with a third window 206. The simulation is run in digital view from 60 ns to 90 ns and is continued from the first window 202.

In some embodiments, the following command may be used to launch the first run, the second run, and the third run. For the first window 202:

```
>simv__dig -ucli -do snps__rtvs__0.ucli
ucli%dump -file snps__rtvs__0.fsdb -type fsdb
ucli%dump -add / -depth 0 -fid FSDB0
ucli%run 30ns
```

For the second window 204:

```
>simv__msv -ucli -do snps__rtvs__1.ucli
ucli%dump -file snps__rtvs__1.fsdb -type fsdb
ucli%dump -add / -depth 0 -fid FSDB0
ucli%dump -disable
#internal issue "skip analog 30ns" cmd
ucli%run 30ns #analog engine does not simulate
ucli%dump -enable
#auto apply initial value for analog nodes
ucli%run 30ns
```

For the third window 206:

```
ucli% dump -disable   # No output waveform
ucli% run 30ns #results are not adopted for the
second window
ucli% dump -enable
ucli% run   # run the third window to the end
```

As described previously, the command may be used in a control file of a mixed-signal verification tool to enable multiple simulation windows with different view configurations. In some aspects, the command may have the following syntax:

```
multi_view_sim start=time1 [icfile=file1] [afile=file2]
[end=time2] [start ...icfile ... afile ... end ...]
[control="control_file"]   simv_cmd="simv_commands"
[node_map=node_map_file]
```

A first parameter of the command (e.g., start=time1) may be used to indicate a start time for the simulation. In some aspects, the start time may correspond to the start time of the mixed simulation.

A second parameter of the command (e.g., icfile=file1) may be used to set initial values for the mixed simulation. For example, the initial value may correspond to initial values of one or more cells. The second parameter is optional. In some aspects, the second parameter is specified between the first parameter that specifies the start time and a fourth parameter that specifies the end time of the window. The initial values set by the second parameter are associated with a single window slot. The single window slot is defined by the start time and the end time.

A third parameter of the command (e.g., afile=file2) may be used to append additional simulator settings for the mixed simulation in an appended file (e.g., adding some simulation control options). The control settings may include, but are not limited to, accuracy/speed control options. For example, rtvs_win start=10 ns afile=new.cfg end=20 ns start=30 ns end=40 ns control=spice1.init. The third parameter is optional and may not be provided by the user. The third parameter may be provided between the first parameter that specifies the start time of the window and the fourth parameter that specifies the end time of the window. The additional simulator settings affects only the single window slot. Thus, an appended file may be provided for each time window specified in the command. For example, the analog simulator (e.g., SPICE) setting may include temperature, SPICE stimuli, probe, and the like.

The fourth parameter of the command (e.g., end=time2) may be used to specify the end time for the mixed simulation. The end time is paired with the start time. In some aspects, a user may specify multiple pairs of start times and end times. In some aspects, if the last end time of the multiple pairs is not specified, then the end time may be set to the end time of the simulation.

A fifth parameter of the command (e.g., control="control_file") may be used to specify a file that includes settings for the mixed-signal simulator. In accordance with a non-limiting example, the view selection setting of "use_[view]" for different windows may be specified using the file (e.g., "use_spice") for the mixed simulation window.

In some embodiments, if the configuration file includes multiple commands (e.g., multi_view_sim), the control file specified by the fifth parameter is applied only to the current command window (i.e., not accumulated). In some embodiments, if the user desire to apply the analog simulator setting to all windows, then the user may specify the analog simulator setting in an initial file. For example, as a non-limiting example, this can be achieved by using a global "use_spice" in the initial file.

In some embodiments, a sixth parameter of the command (e.g., simv commands) may be used to specify runtime simulation options. The options may include commands to capture and save the memory image of the simulation executable (e.g., simv) at a given point and quit the simulation. In some aspects, the sixth parameter is optional since there is no need to run the executable binary (e.g., simv) manually using the approaches described herein. In some aspects, if the simulation options are not specified, then default settings may be applied. For example, simv_cmd=simv may be applied. A unified command line interface (UCLI) is supported with limitation. The UCLI file format that may be supported is described further below.

A seventh parameter of the command (e.g., node_map=node_map_file) may be used to specify a node mapping between digital and analog views. In some embodiments, the file may be provided when the nodes have different names in the analog view and the digital view.

As described previously herein, the utility may launch compile time and run time sequentially. It parses the command (e.g., multi_view_sim) to get the information on the RTVS simulation. The information may include information associated with the simulation window. The utility controls the flow to enable the simulation and monitor a status of the simulation. In some aspects, the utility may enable an automated flow. In some embodiments, the utility may have the following syntax:

```
msv_mview_vcs vcs_elabration options [-no_elab]
```

In some embodiments, the user may specify command line options for the digital simulator using the utility (e.g., using vcs_elabration options). For example, the user can specify command line options for the digital simulator (e.g., VCS). The options are communicated to the run time command of the digital simulator (e.g., VCS). In some aspects, a control file to enable the mixed-signal feature in the digital simulator may be used. In accordance with a non-limiting example, in VCS the option"-ad=" is specified, otherwise the utility msv_mview_vcs may error out.

In some aspects, the user may enable an interactive mode. In some aspects, if "-debug_access+all" is not specified, msv_mview_vcs automatically add it. This option may enable debug capabilities. In some aspects, a parameter (e.g., -R) to run the simulation may be skipped because the RTVS flow may automatically launch run time after compiling.

In some aspects, the command line options for the digital may be used to specify which features are turned on and which features are turned off. A macro (e.g., RTVS_Mixed) may be used to include cross module referencing (XMR) statements. For example, if the user has XMR (cross module referencing) statements such as statements to force a voltage on a node (e.g., snps_force_volt( ) or statements to sample voltage values from the node (e.g., snps_get_volt( ), the user may include these statements inside the macro (e.g., RTVS_MIXED). And the user may specify an option (e.g., +define) to specify the macro in the elaboration options of the utility. In accordance with a non-limiting example, the user may use "+define+RTVS_MIXED" in the elaboration option. This may be used by the user to specify which features are turned on and which feature are turned off. The macro (e.g., RTVS_MIXED) can only be defined for the mixed-signal simulation so that different testbenches can be specified inside the users source code (e.g., Verilog) to address different names and usage for different views.

In some aspects, a parameter of the utility (e.g., [-no_elab]) may be used by the user to adjust window setting without recompiling the design. For example, a mixed-signal control file (e.g., vcsAD.init) can be modified by the user and the utility (e.g., msv_mview_vcs) may be run with the parameter (e.g., [-no_elab]).

In some embodiments, due to the complexity of the digital testbench, digital simulation cannot start in the middle of the simulation. For example, if the simulation includes a first time window and a second time window, the digital simulation cannot start at the second time window. Thus, to ensure the integrity of the simulation states, digital simulation cannot be skipped. It may run throughout the entire simulation period. Analog simulation, on the other hand, can be started in the middle of the simulation period by providing proper initial states at the start of the simulation window in the analog view.

In some embodiments, since the conventional MSV flow does not support dynamic view switch, separate executable binary are created (e.g., simv) to do the time-based co-simulation instead of a single executable binary (e.g., simv).

Referring back to FIG. 2, in digital simulation windows (i.e., the first window and the third window), a digital simulator performs the simulations. For example, pure digital simv (simv_dig) does the simulation. In MSV window (i.e., the second window), the analog simulator performs the simulations. For example, MSV simv (simv_msv) does the simulation.

These two executables (simv_dig, simv_msv) may be launched in the following manner:

In the pure-digital simulation window, digital simv is launched. It runs to the end of the simulation window. The waveforms of the signals are dumped into a waveform file. Only the signals in the blocks to be switched to the analog view are used for the RTVS flow purpose.

In the next MSV window, the MSV executable (MSV simv) is launched. The MSV simv may start the simulation from the beginning t=0. The digital testbench may still be simulated on the digital blocks. But the simulation on the analog blocks is skipped for the first window (pure digital). This feature is implemented by the analog engine. The analog engine may skip the event simulation but may move forward the simulation time. And the analog to digital interface events in this first window (pure digital) are captured from the first digital simulation (e.g., simv_dig simulation). The analog to digital events can be reconstructed from the waveform file in the first digital simulation (i.e., simv_dig simulation). These events are simulated in the first window period of the MSV simulation (i.e., simv_msv simulation). This reconstruction of the interface events can ensure the integrity of the MSV simulation for the digital blocks for the first digital only window.

After the MSV finishes the first window by skipping the analog block simulation, MSV sets up the proper initial states for the second mixed-signal (MSV) window. Since the digital blocks are simulated correctly in the first window, at this moment, the initial states of the analog block are annotated.

The initial states of the analog blocks may be retrieved from the waveform file from the digital simulation for the first window. Then, the latest states (i.e., from the digital simulation) of all the nodes in the analog blocks may be annotated to the analog blocks at the beginning of the second window. This command can be passed to an analog simulator as a statement that provides initial conditions for the nodes in the analog blocks. In accordance with a non-limiting example, in SPICE this can be accomplished using ".ic" statements in the standard SPICE format. On the other hand, the initial states of the digital blocks may not be annotated since the simulation on the digital blocks has been continued from the beginning of t=0 in this mixed simulation. After the initial states are properly annotated, the executable may simulate the second window with the MSV view configuration.

In the third window, the simulation switches back to the digital simulation. The simulation can be continued from the first window digital simulation (simv_dig). The correctness of the simulation states can be guaranteed. At the same time, the simulation can be launched independently to shorten the overall wait time for the results.

In some embodiments, when switching windows, the initial value of the next window comes from the waveform file dumped from a previous window. The RTVS approach described herein may implement a task to read the latest states of the nodes data point from the waveform file. This is used for annotating the analog blocks initial values from the first window digital results. Table 1 shows digital values and the corresponding analog values.

TABLE 1

Digital values and the corresponding analog values.

| Output digital values | Analog values |
|---|---|
| 0 | lov (low_voltage of d2a) |
| 1 | hiv (high_voltage of d2a) |
| X | x2v control |
| Z | lov (low_voltage of d2a) |

In some embodiments, a digital simulation is continued in the first window of simv_msv simulation. However, the simulation results may not be generated since the simulation is performed on continuation purpose only.

In some embodiments, generating two different executables (e.g., simv) enable running simulations in parallel to improve the overall speed of obtaining the final results. For example, while the second window of simv_msv depends on the first window results, the digital simulation (i.e., executable simv_dig) does not depend on the mixed signal simulation (i.e., simv_msv) results. So the executable (e.g., simv_dig) for the digital simulation can be launched as a parallel task without waiting for the mixed signal simulation (e.g., simv_msv) results.

In some embodiments, the utility (e.g., msv_mview_vcs) may launch two command lines in the mixed signal simulator to generate a digital simv and a mixed simv binary. For example, the command line may be:

```
msv__mview__vcs tb.v -ad=vcsAD.init -debug__access -l
vcs.log -Mdir=csrc
```

The utility may invoke the following real compile time commands in VCS:

```
vcs tb.v -debug__access -l vcs.log__dig -Mdir=csrc__dig
-o simv__dig
vcs tb.v -ad=snps__rtvs__0.init -debug__access -1
vcs.log__msv -Mdir=csrc__msv -o simv__msv
```

In some embodiments, the utility generates the simv command line and corresponding ucli file for each simv window. For example, the utility may generate the following:

```
simv__dig -ucli -do snps__rtvs__0.ucli ...
simv__msv -ucli -do snps__rtvs__1.ucli ...
simv__dig -ucli -do snps__rtvs__2.ucli ...
...
```

In some embodiments, to assure clean transitions between different windows (different view configurations), the user may select a suitable time to switch windows (views). In some aspects, the suitable time may correspond to a time where there is no unfinished critical events or transitions at the time of swapping views. In the example shown in FIG. 2, t1 and t2 may be selected such as all critical operations are finished before the time point of switching view. Critical operations may include operations such as toggles so that transitions does not happen in the middle of a toggle. For example, all critical operations in the first time window 302 may be finished before t1. In some embodiments, the simulation may run even if this condition is not met, however the results may not be accurate or displayed.

In some embodiments, an idle period (i.e., stimulus free, time buffer) may be used before and after the switching moment. The idle period before the switching is to allow all the scheduled (critical) events from the previous window to finish. The idle period after the switching is to allow the initial conditions to propagate to the entire design so that the design is on a steady and consistent state. In some embodiments, the idle period and/or the switching may be skipped.

In some embodiments, output waveforms are generated during the simulation. In some embodiments, digital simulation (e.g., digital simv) may generate one waveform file and the mixed simulation (e.g., MSV simv) may generate an additional waveform file. This feature enables unified dump by default. Proper states are generated in the waveform files for an invalid period of the simulation. The invalid period may refer to a time window when the block is not run in the digital view or in the analog view. For example, the first window 202 is an invalid period for the mixed simulation.

Figure 3:
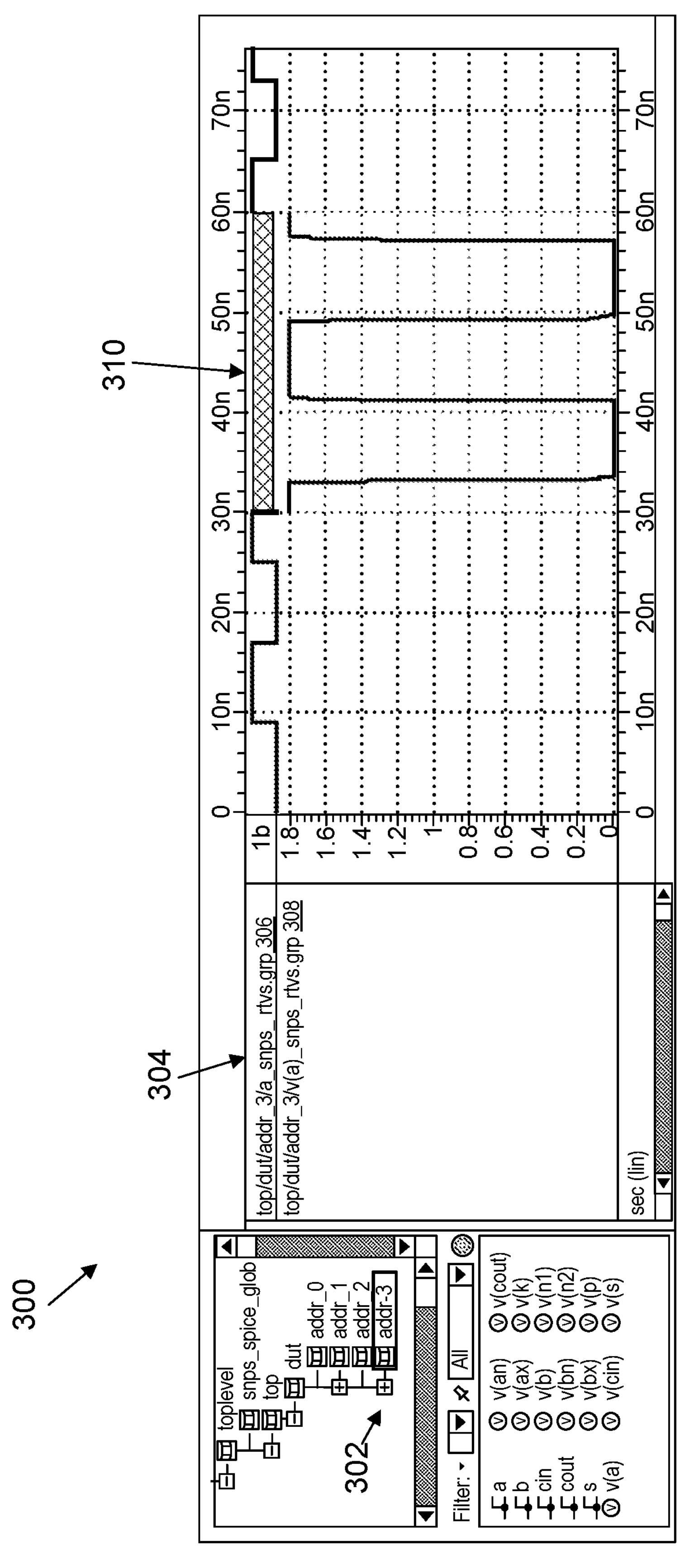
FIGS. 3-5 are schematics that illustrate example outputs of mixed signal simulations, in accordance with an embodiment of the present disclosure.

FIG. 3 is a schematic that illustrates a graphical waveform viewer (WV) 300 in accordance with an embodiment of the present disclosure. The graphical WV 300 shows an example output of mixed signal simulations. The graphical WV 300 may display all signals associated with the two waveforms (digital and mixed simulations) under one hierarchy tree. A digital signal and a corresponding analog signal cannot be merged into one panel. For example, if the user clicks a signal name 302, the digital signal and the corresponding analog signal may be shown under one hierarchy tree 304 (e.g., digital signal 306 (top.dut.addr_3.a) and mixed signal 308 (top.dut.addr_3.v(a)). The graphical WV 300 may show the signal with a disabled window unconnected. Digital signal 306 is marked as disabled in the range from 30 ns to 60 ns as shown by hash pattern 310. Mixed signal 308 is marked as blank in the range from 0 ns to 30 ns and in the range from 60 ns to 80 ns which correspond to the first window 202 and the third window 206, of FIG. 2 respectively.

Figure 4:
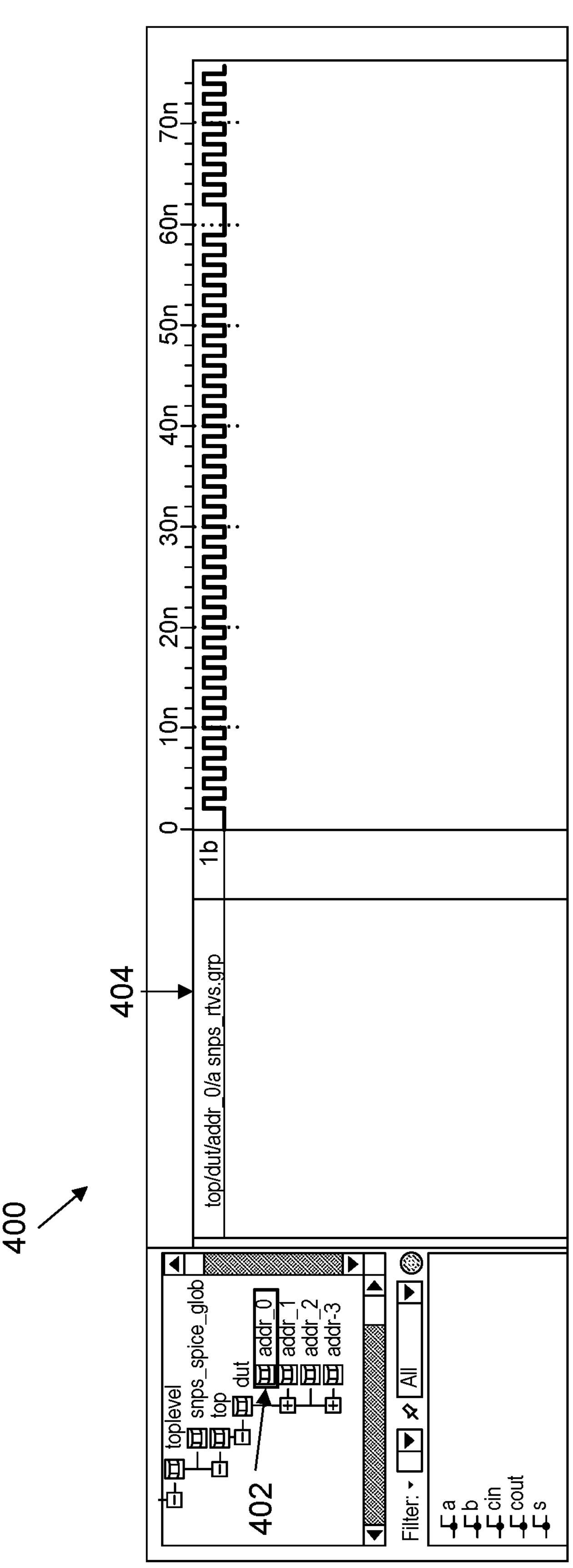

FIG. 4 is a schematic that illustrates an example output of mixed signal simulations in accordance with an embodiment of the present disclosure. Pure digital signals can be merged into one panel in a graphical WV 400. For example, a signal 402 corresponding to the first block 110 of FIG. 1B may be shown for the entire simulation window. A digital waveform 404 (top.dut.addr_0.a) is merged in a range from 0 ns to 80 ns (i.e., for the entire simulation window). Thus, the results from the first, second, and third windows of FIG. 2 are merged and shown as a single waveform.

Figure 5:
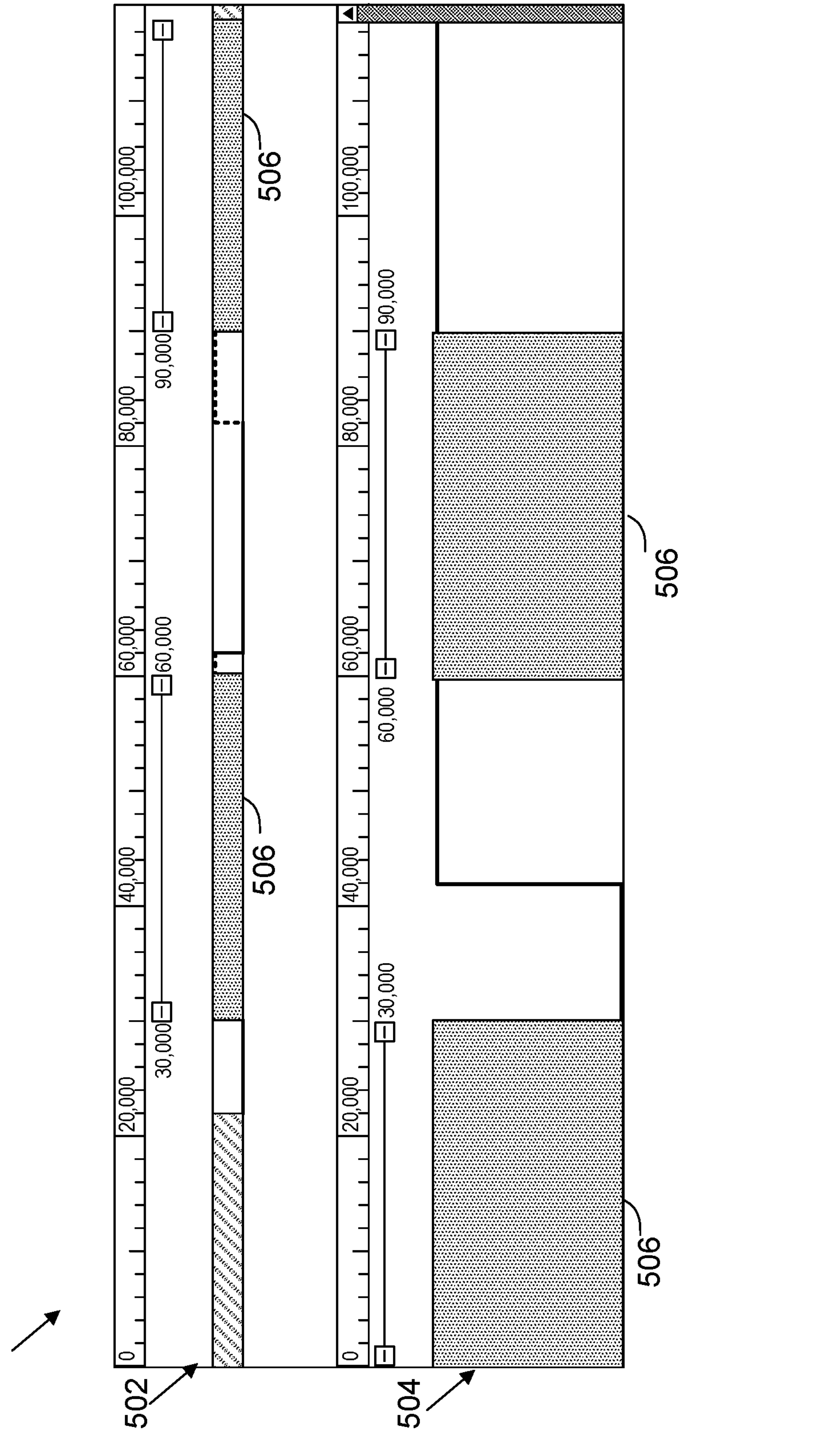

FIG. 5 is a schematic 500 that illustrates an example output of mixed signal simulations in accordance with an embodiment of the present disclosure. The waveforms may be displayed using Verdi® nWave tool from Synopsys. With the Synopsys Verdi® nWave tool, the user can open two files such as fast signal data base (fsdb) individually to observe the waveform. A first panel 502 shows a digital view of the signal while a second panel 504 shows an analog view of the signal. The invalid periods may be shown as blocks 506.

In some embodiments, cross module reference (XMR) is a common usage in a digital testbench. However, when adopting the RTVS technique described herein, users may desire to take into account the equivalence between the digital view and the analog view. For example, there is no equivalent setting in SPICE to a "force" statement in Verilog. And this may lead to some complications or limitations as described further below.

In some embodiments, a force statement may be applied on digital only block (e.g., first block 110 of FIG. 1) when using the RTVS technique described herein. Force may be used in the first window or the second window since force/deposit may not take effect on those forced nodes. And this is the desired behavior.

In some embodiments, if the force is applied on the switching block. Then, an equivalent setup may be used for the SPICE block. For example, users may use the following syntax when the equivalent SPICE node has the same name:

```
force test.ild.dl=1'b0;
```

If the equivalent node has a different name, then the following macro may be used in the second window for the mixed simulation (i.e., simv_msv):

```
`ifdef RTVS__MIXED
snps__force__volt (test.xi1d.d1, 0.0);
`else
force test.i1d.d1 = 1'b0;
`endif
```

Figure 6:
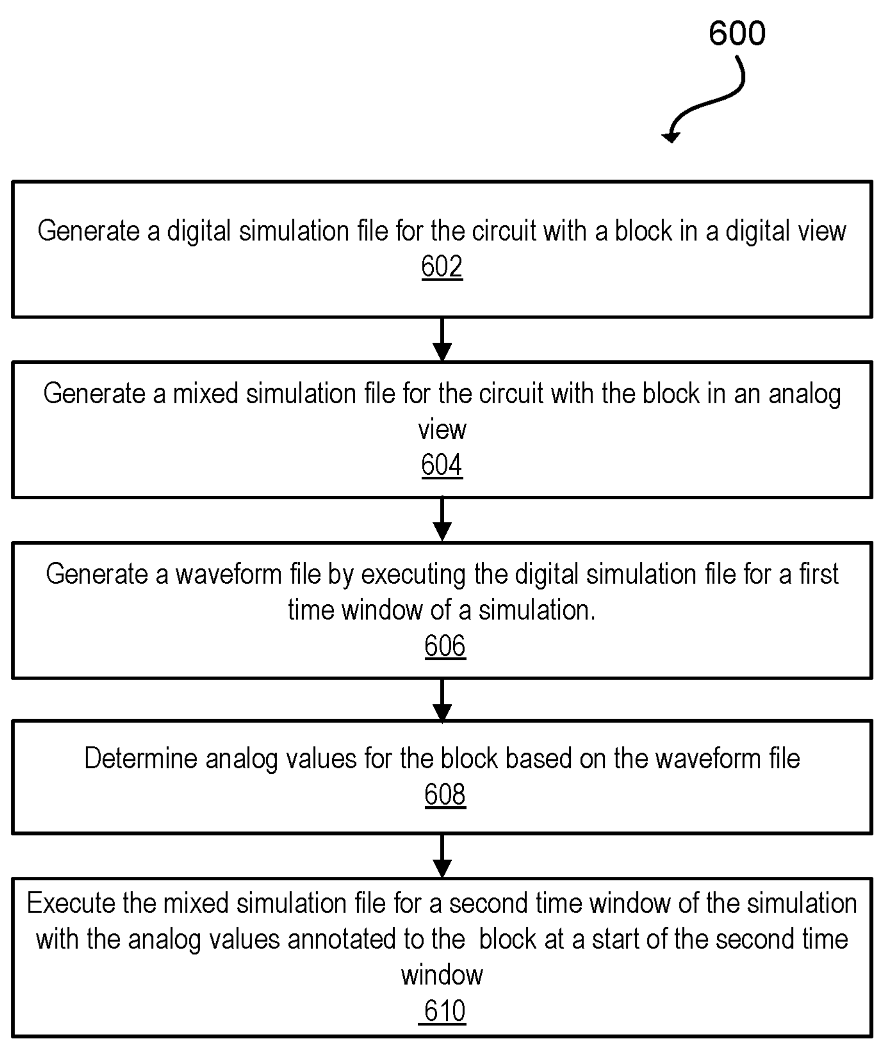
FIG. 6 is a flowchart for a method for executing a mixed signal simulation, in accordance with an embodiment of the present disclosure.

FIG. 6 illustrates a flowchart for a method 600 for executing a mixed signal simulation, in accordance with an embodiment of the present disclosure. A block setting may switch between the digital view and the analog view during the simulation in accordance with one or more embodiments. In some aspects, the circuit may include one or more blocks. The simulation may include two or more windows. In some aspects, during a first window, pure digital simulation is desired. In a second window, a mixed simulation is desired. For example, at least one block is in a digital view and another block is in an analog view.

At 602, a digital simulation file (e.g., executable file simv_dig) for a circuit is generated. In the digital simulation file, the one or more blocks are in the digital view.

At 604, a mixed simulation file (e.g., executable file simv_msv) for the circuit is generated. In the mixed simulation file, the block is in the analog view. In some aspects, the additional block is in the digital view.

At 606, a waveform file is generated by executing the digital simulation file for the first time window of the simulation. The waveform file is the result of executing the digital simulation file for the first time window. In some aspects, the mixed simulation file is executed for the first time based on or using the waveform file. Specifically, as discussed above, the analog to digital interface events (from execution of the digital simulation file during the first window) can be reconstructed from the waveform file and then used in the simulation of the mixed simulation file during the first window.

The execution of the mixed simulation file for the first time window skips simulation of the block during the first time window. In some aspects, a digital value is associated with an additional block after executing the mixed simulation file. The additional block may be in digital view in all simulation windows. For example, the final digital values associated with the block after execution of the mixed simulation file for the first time window are carried over for the start of the second time window. As discussed above, the initial states of the digital blocks do not need to be annotated since the simulation on the digital blocks has been continued from the beginning of t=0 in the mixed simulation file (e.g., simv_msv).

At 608, the analog values for the block are determined based on the waveform file. Specifically, the digital values associated with the block (at the end of the first time window) are converted to analog values for the start of the second time window (i.e., from step 606).

At 610, the mixed simulation file is executed for the second time window of the simulation with the analog values annotated to the block at a start of the second time window. In some aspects, the digital simulation file is executed for the second time window and a third time window for the simulation.

In some embodiments, execution of the digital simulation file is resumed for the second time window of the simulation and a third window of the simulation. This may be performed in parallel to step 610.

In some embodiments, the outputs from steps 606 and 610 may be merged and displayed on a wave viewer (as shown, for example, in FIG. 3).

In some embodiments, the simulation may include another one or more switches from the digital view to the analog view. For example, the simulation for the block may switch from the digital view to the analog view, then from the analog view to the digital view, and then from the digital view to the analog view. Thus, the mixed simulation file may be executed for a fourth time window of the simulation.

Figure 7:
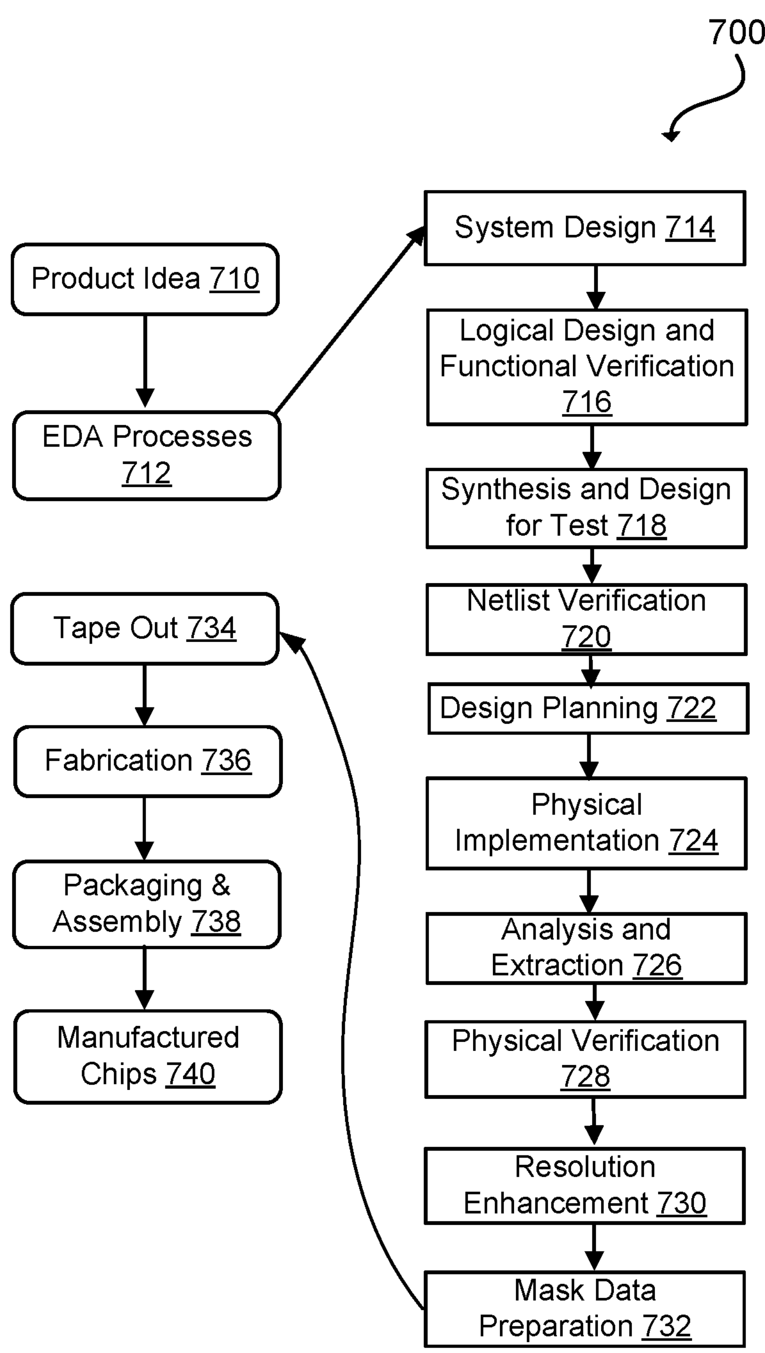
FIG. 7 depicts a flowchart of various processes used during the design and manufacture of an integrated circuit, in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described can be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
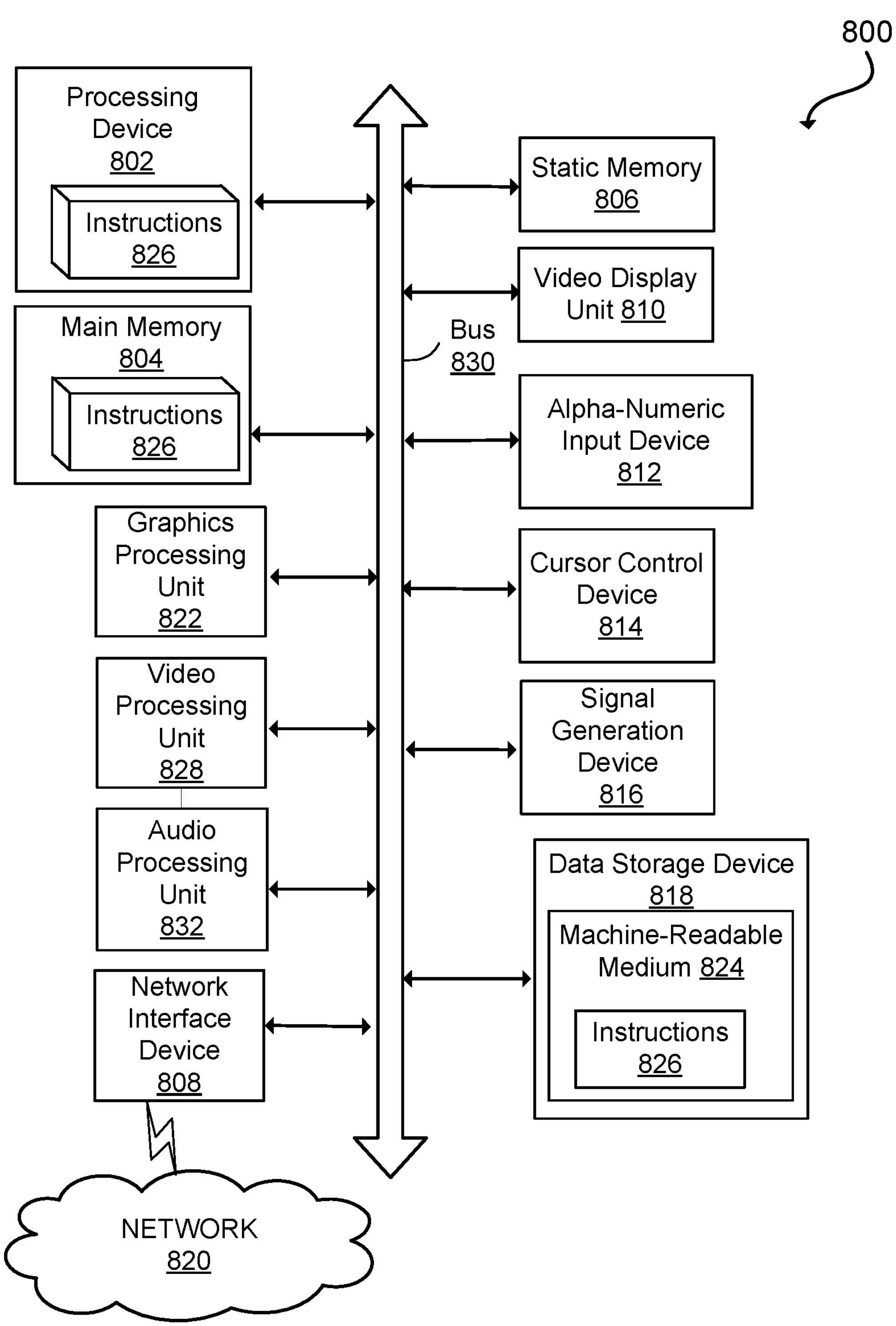
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for simulating a circuit, comprising:

generating a digital simulation file for the circuit, wherein the circuit comprises a block and wherein the digital simulation file corresponds to the block in a digital view;

generating a mixed simulation file for the circuit, wherein the mixed simulation file corresponds to the block in an analog view;

generating a waveform file by executing the digital simulation file for a first time window of a simulation;

executing the mixed simulation file for the first time window of the simulation based on the waveform file, wherein the execution of the mixed simulation file for the first time window skips simulation of the block during the first time window;

determining a plurality of analog values for the block based on the waveform file, wherein the plurality of analog values correspond to initial states of one or more nodes of the block acquired from the waveform file; and executing, by one or more processors, the mixed simulation file for a second time window of the simulation with the plurality of analog values annotated to the block at a start of the second time window.

2. The method of claim 1, wherein the circuit comprises an additional block, wherein the digital simulation file corresponds to the additional block in the digital view, and wherein the mixed simulation file corresponds to the additional block in the digital view.

3. The method of claim 2, further comprising:

associating the additional block with a digital value after executing the mixed simulation file for the first time window.

4. The method of claim 2, further comprising:

executing the digital simulation file for the second time window of the simulation and a third time window of the simulation.

5. The method of claim 4, wherein executing the mixed simulation file for the second time window is performed in parallel with executing the digital simulation file for the second time window.

6. The method of claim 1, further comprising:

acquiring the initial states from the waveform file.

7. The method of claim 1, wherein the second time window includes a first idle period at the start of the second time window and a second idle period at an end of the second time window.

8. The method of claim 1, further comprising:

displaying in a graphical window a first waveform and a second waveform, wherein the first waveform corresponds to a digital signal and the second waveform corresponds to the corresponding analog signal; and masking the first waveform for a duration of the second time window.

9. The method of claim 1, further comprising:

receiving information indicative of a start time and an end time of a plurality of mixed simulation windows of the simulation; and executing the mixed simulation file for each of the plurality of mixed simulation windows.

10. A system for simulating a circuit, comprising:

a memory storing instructions; and a processor, coupled with the memory and to execute the instructions, the instructions when executed cause the processor to:

generate a digital simulation file for the circuit, wherein the circuit comprises a block and wherein the digital simulation file corresponds to the block in a digital view, generate a mixed simulation file for the circuit, wherein the mixed simulation file corresponds to the block in an analog view, generate a waveform file by executing the digital simulation file for a first time window of a simulation, execute the mixed simulation file for the first time window of the simulation based on the waveform file, wherein the execution of the mixed simulation file for the first time window skips simulation of the block during the first time window, determine a plurality of analog values for the block based on the waveform file, wherein the plurality of analog values correspond to initial states of one or more nodes of the block acquired from the waveform file, and execute the mixed simulation file for a second time window of the simulation with the plurality of analog values annotated to the block at a start of the second time window.

11. The system of claim 10, wherein the circuit comprises an additional block, wherein the digital simulation file corresponds to the additional block in the digital view, and wherein the mixed simulation file corresponds to the additional block in the digital view.

12. The system of claim 11, wherein the processor is further configured to:

associate the additional block with a digital value after executing the mixed simulation file for the first time window.

13. The system of claim 11, wherein the processor is further configured to:

execute the digital simulation file for the second time window of the simulation and a third window of the simulation.

14. The system of claim 13, wherein executing the mixed simulation file for the second time window is performed in parallel with executing the digital simulation file for the second time window.

15. The system of claim 10, wherein the processor is further configured to:

acquire the initial states from the waveform file.

16. The system of claim 10, wherein the second time window includes a first idle period at the start of the second time window and a second idle period at an end of the second time window.

17. The system of claim 10, wherein the processor is further configured to:

display in a graphical window a first waveform and a second waveform, wherein the first waveform corresponds to a digital signal and the second waveform corresponds to the corresponding analog signal; and mask the first waveform for a duration of the second time window.

18. A non-transitory computer readable medium comprising stored instructions for simulating a circuit comprising a first block and a second block, which when executed by a processor, cause the processor to:

generate a digital simulation file for the circuit, wherein the circuit comprises a block and wherein the digital simulation file corresponds to the block in a digital view;

generate a mixed simulation file for the circuit, wherein the mixed simulation file corresponds to the block in an analog view;

generate a waveform file by executing the digital simulation file for a first time window of a simulation;

execute the mixed simulation file for the first time window of the simulation based on the waveform file, wherein the execution of the mixed simulation file for the first time window skips simulation of the block during the first time window;

determine a plurality of analog values for the block based on the waveform file, wherein the plurality of analog values correspond to initial states of one or more nodes of the block acquired from the waveform file; and execute the mixed simulation file for a second time window of the simulation with the plurality of analog values annotated to the block at a start of the second time window.

* * * * *